(12) United States Patent
Zhou et al.

(10) Patent No.: US 10,608,022 B2
(45) Date of Patent: Mar. 31, 2020

(54) ARRAY SUBSTRATES, DISPLAY DEVICES AND METHODS OF MANUFACTURING ARRAY SUBSTRATES

(71) Applicant: Kunshan Go-Visionox Opto-Electronics Co., Ltd., Kunshan (CN)

(72) Inventors: Zhiwei Zhou, Kunshan (CN); Xiuqi Huang, Kunshan (CN); Siming Hu, Kunshan (CN); Yanqin Song, Kunshan (CN); Weilong Li, Kunshan (CN); Zhenzhen Han, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/446,655

(22) Filed: Jun. 20, 2019

(65) Prior Publication Data

US 2019/0312060 A1    Oct. 10, 2019

Related U.S. Application Data

(63) Continuation of application No. PCT/CN2018/110691, filed on Oct. 17, 2018.

(30) Foreign Application Priority Data

May 14, 2018   (CN) .......................... 2018 1 0453667

(51) Int. Cl.
*G06F 3/041*    (2006.01)
*G06F 3/044*    (2006.01)
*H01L 27/12*    (2006.01)

(52) U.S. Cl.
CPC .......... *H01L 27/124* (2013.01); *H01L 27/127* (2013.01); *H01L 27/1218* (2013.01)

(58) Field of Classification Search
CPC ............ H01L 27/124; G09G 2360/144; G09G 3/3208; G06F 3/0412; G06F 2203/04111; G06F 2203/04101; G06F 2203/04106
See application file for complete search history.

(56) References Cited

U.S. PATENT DOCUMENTS

| 2014/0285953 | A1* | 9/2014 | Hirai ..................... G06F 1/1637 361/679.01 |
| 2017/0075174 | A1 | 3/2017 | Lee et al. |
| 2017/0162822 | A1* | 6/2017 | Park .................... H01L 27/3258 |

FOREIGN PATENT DOCUMENTS

| CN | 204613909 U | 9/2015 |
| CN | 107315295 A | 11/2017 |
| CN | 107561806 A | 1/2018 |
| CN | 207217536 U | 4/2018 |
| CN | 108550584 A | 9/2018 |

\* cited by examiner

*Primary Examiner* — Caridad Everhart
(74) *Attorney, Agent, or Firm* — Kilpatrick Townsend & Stockton LLP

(57) ABSTRACT

The present application provides an array substrate and a display device. The array substrate includes a substrate provided with a display region and a non-display region. The display region is configured to display. The non-display region includes a groove region. The groove region has a light transmittance greater than that of the display region. The display device includes the above-described array substrate.

16 Claims, 4 Drawing Sheets

ARRAY SUBSTRATES, DISPLAY DEVICES AND METHODS OF MANUFACTURING ARRAY SUBSTRATES

CROSS-REFERENCES TO RELATED APPLICATIONS

The present application is a continuation application of International Application No. PCT/CN2018/110691, filed on Oct. 17, 2018, which claims the priority to Chinese Application No. 201810453667.5, filed on May 14, 2018. The entireties of these applications are incorporated by reference herein for all purposes.

FIELD

The present application relates to display technologies.

BACKGROUND

With the continuous update and iteration of display device products, a large-screen display device is more and more popular with users, thus an external structure and an internal structure of a display panel are also constantly updated. Nowadays, a popular method is to define a slotted region at a top of a rectangular display panel where elements such as a front camera is able to be placed.

DETAILED DESCRIPTION OF THE INVENTION

Embodiments of the present application will be described in detail below with reference to the accompanying drawings, so that the above objects, features and advantages of the present application can be more apparent and understandable. Numerous specific details are set forth in the following description in order to provide a thorough understanding of the present application. However, the present application can be implemented in many other ways different from those described herein, and a person skilled in the art can make similar modifications without departing from the application, and therefore, the present application is not limited by the specific embodiments disclosed below.

As explained above, it has been desirable to make a shaped array substrate. However, since a slotted region has a notch of many different shapes, and when the slotted region is defined, each layer of substrates and film layers of the display panel needs to be cut, causing great difficult in manufacturing processes. In addition, the slotted region needs to occupy an upper frame region of the display panel, thus many circuits of the display panel are provided in a lower frame region of the display panel, resulting in a small display region of the display panel.

Figure 1:
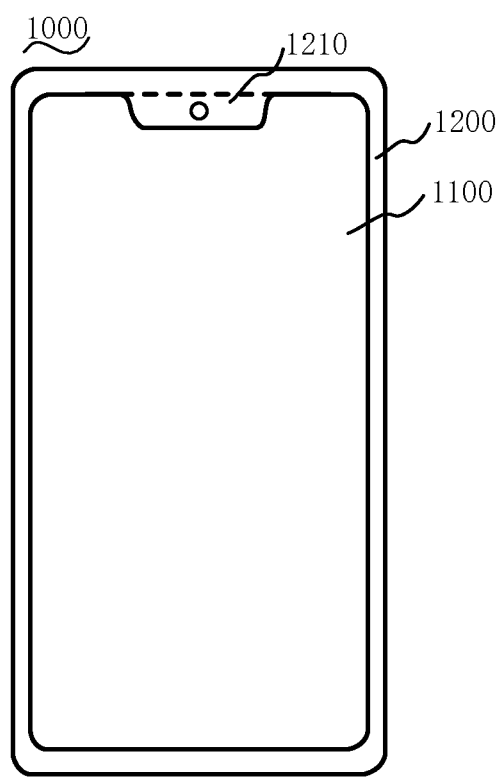
FIG. 1 is a schematic view of an array substrate in an embodiment.

Please refer to FIG. 1 which illustrates a schematic view of an array substrate according to an embodiment of the present application.

As shown in FIG. 1, the array substrate 1000 includes a substrate provided with a display region 1100 and a non-display region 1200. In an embodiment, the non-display region 1200 includes a bezel region and a groove region 1210. In an embodiment, the groove region 1210 may form a non-closed opening region and be opened at one edge of the display region 1100, and an opening direction of the groove region faces to an outside of the substrate. In other embodiments, the groove region 1210 may form a closed region and be opened inside the display region 1100. Specifically, film layer structures such as a buffer layer, a gate insulating layer, an interlayer insulating layer and the like are deposited sequentially on the substrate. In an region of the substrate corresponding to the groove region 1210, the film layer structures such as the buffer layer, the gate insulating layer, the interlayer insulating layer, and the like are etched, so that only the substrate is remained. Thus, the groove region 1210 has a higher light transmittance than that of the display region 1100 except the groove region 1210, thereby an optical element such as a camera may be placed under a position corresponding to the groove region without affecting a performance of the optical element. Pixel units are distributed on the display region 1100, so that the display region 1100 may realize display.

In the above-described array substrate, the groove region is provided on the substrate, reducing the manufacturing difficulty of the groove region. In addition, since part of the substrate is remained in the groove region and the groove region has a high light transmittance, a circuit, an integrated element or a signal line and the like may be provided in the groove region, thereby reducing a bezel area of the array substrate to increase a display area of the array substrate, and thereby improving a screen ratio of the display device.

Figure 2:
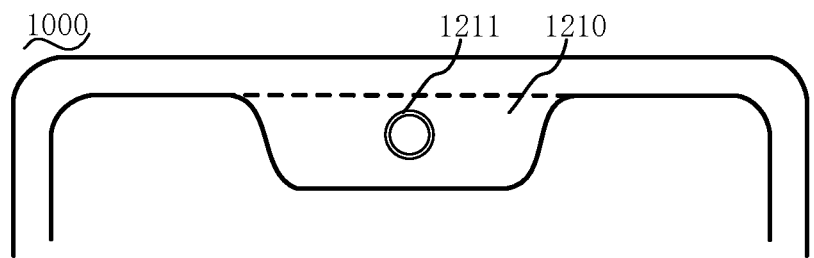
FIG. 2 is a partial schematic view of an array substrate in an embodiment.

In an embodiment, as shown in FIG. 2, an optical element light-transmitting region 1211 is preset in the groove region 1210. An area of the optical element light-transmitting region 1211 is less than an area of the groove region 1210.

The optical element is generally provided under a display panel, and the optical element receives lights through the display panel. In an embodiment, the optical element receives lights through the optical element light-transmitting region 1211. Since the area of the optical element light-transmitting region 1211 is less than the area of the groove region 1210, a circuit, an integrated element, a signal line or the like may be arranged at a position of the groove region 1210 not occupied by the optical element light-transmitting region 1211. It should be noted that the circuit, the signal line or the integrated element arranged around the optical element needs to avoid a position right above the optical element light-transmitting region 1211, so that lights outside may not be blocked and may be received by the optical element through the optical element light-transmitting region 1211.

Figure 3:
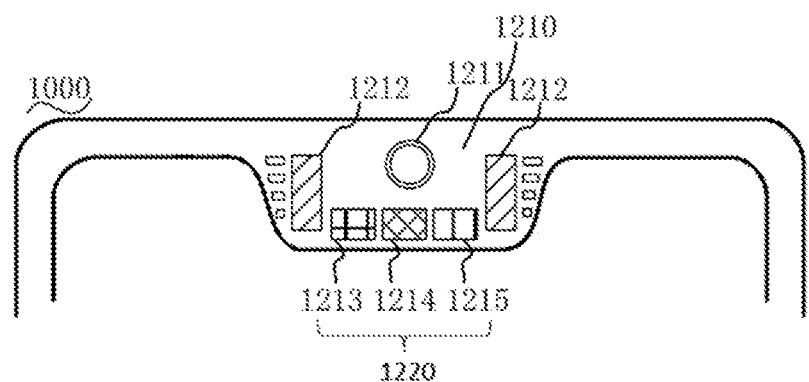
FIG. 3 is a partial schematic view of an array substrate in another embodiment.

In an embodiment, as shown in FIG. 3, the array substrate 1000 further includes a gate driving circuit 1212 and a peripheral circuit. The gate driving circuit 1212 and the peripheral circuit are provided in the groove region 1210, and are located at periphery of the optical element light-transmitting region 1211. Specifically, the gate driving circuit 1212 and the peripheral circuit may be provided at a position of a left bezel, a right bezel or a lower bezel of the groove region 1210. In this embodiment, the gate driving circuit 1212 provided in the groove region 1210 is configured to drive the display region on both sides of the groove region 1210. Specifically, there is one or more gate driving circuits 1212. In an embodiment, there are two gate driving circuit provided on both sides of the optical element light-transmitting region 1211, and connected several compensation capacitors for compensating light to scanning driving lines of the display region on both sides of the groove region 1210. The compensation capacitor may be provided between the display region and the gate driving circuit 1212 along an edge of the groove region 1210, and may be provided at other positions of the groove region 1210. In an embodiment, the compensation capacitor of different capacities and volumes may be selected according to different required compensation values.

In an embodiment, as shown in FIG. 3, the peripheral circuit 1220 includes one or more kinds of circuits of a multiplex selection circuit 1213, an electrostatic discharge circuit 1214, and a screen test circuit 1215. Specifically, the multiplex selection circuit 1213 is configured to help the display panel to perform a lighting test. The electrostatic discharge circuit 1214 is configured to protect an important component in the display device from electrostatic damage. The screen test circuit 1215 is configured to perform a closed circuit and short circuit test to a signal connection line on the display panel. In this embodiment, the multiplex selection circuit 1213, the electrostatic discharge circuit 1214 and the screen test circuit 1215 may be provided at a peripheral position of the optical element light-transmitting region 1211, and avoid the position right above the optical element light-transmitting region 1211. Since gate driving circuits 1212 are generally provided at the positions of the left bezel and the right bezel of the groove region 1210, the multiplex selection circuit 1213, the electrostatic discharge circuit 1214 and the screen test circuit 1215 may be provided at the position of the lower bezel of the groove region 1210.

A width of the bezel of the array substrate may be effectively reduced by providing the gate driving circuit and the peripheral circuit in the groove region, to realize a narrow bezel design of the array substrate, thereby the screen ratio of the display device may be improved.

Figure 4:
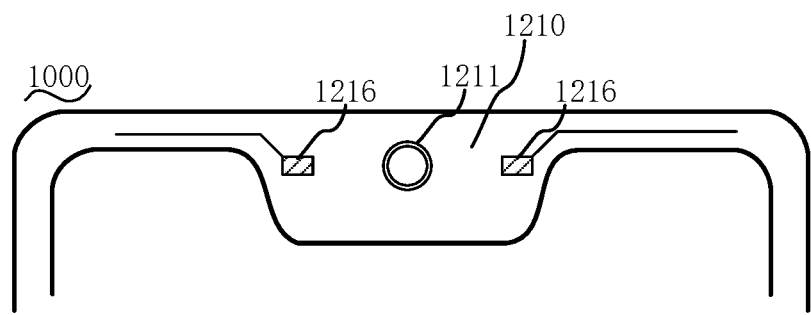
FIG. 4 is a partial schematic view of an array substrate in still another embodiment.

In an embodiment, as shown in FIG. 4, the array substrate 1000 further includes an ambient light sensing element 1216 provided in the groove region 1210 and located at a periphery of the optical element light-transmitting region 1211. Specifically, there is one or more ambient light sensing elements 1216. The ambient light sensing element 1216 has a small volume, occupies a small space, and may be configured to monitor a change of light intensity in the environment, and instruct the display device to perform a corresponding adjustment action according to the change, such as instructing the display device to reduce a display brightness of the display panel in a case where the ambient light is relative strong.

In an embodiment, as shown in FIG. 4, the ambient light sensing element 1216 is a photodiode or a photosensitive thin film transistor. In this embodiment, the photodiode or the photosensitive thin film transistor may be manufactured simultaneously with a thin film transistor (TFT) array on the display region. Specifically, when the TFT array of the display panel is manufactured, different contents and different kinds of trivalent or pentavalent elements may be doped on the basis of ordinary polycrystalline silicon, thereby simultaneously producing the photodiode or the photosensitive thin film transistor for ambient light detection.

The area of the optical element light-transmitting region may be effectively reduced, and an intelligence of the display panel may be improved by integrating the ambient light sensing element in the groove region of the array substrate.

Figure 5:
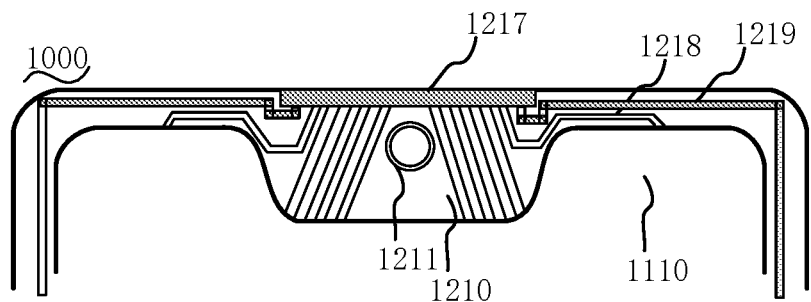
FIG. 5 is a partial schematic view of an array substrate in another embodiment.

In an embodiment, as shown in FIG. 5, the array substrate further includes a conductive pad 1217, a signal connection line 1218 and a power potential line 1219. The conductive pad 1217 is provided at a position in the bezel region opposite to the groove region 1210, such as being provided at a position opposite to an opening direction of the groove region 1210. The signal connection line 1218 is led out from the conductive pad 1217 and extends to the groove region 1210. The power potential line 1219 is provided in the bezel region and is connected to the conductive pad 1217. Specifically, the groove region 1210 has a certain depth, which may provide a winding space for the signal connection line in a bonding region. The bonding region is configured to bond a circuit board, a driving chip and the like, and the circuit board and the driving chip are configured to drive display of the display region 1110. The bonding region is disposed on one side of the display region 1110, which in this embodiment is a side close to the groove region 1210. Additionally, routings of an anode power potential line VDD and a cathode power potential line VSS may be provided in the groove region 1210. Routings of the signal connection line 1218 and that of the power potential line 1219 need to be disconnected at a corresponding position in the groove region 1210 to avoid the optical element light-transmitting region 1211. In this embodiment, one end of the signal connection line 1218 is connected to the conductive pad 1217, and the other end of the signal connection line 1218 is connected to a data line in the display region 1110. The data line in the display region 1110 is connected to a signal driving circuit in the bonding region through the signal connection line 1218 and the conductive pad 1217, to drive the pixel unit in the display region 1110 to display and perform brightness adjustment.

By providing the conductive pad in the bezel of the array substrate, and making full use of the space of the groove region for winding arrangement, the bezel area of the array substrate may be effectively reduced, thereby increasing the area of the display region of the array substrate.

In an embodiment, as shown in FIGS. 3 to 6, the array substrate 1000 includes one or more circuits, integrated elements or signal lines selected from the group consisting of the gate driving circuit 1212, the multiplex selection circuit 1213, the electrostatic discharge circuit 1214, the screen test circuit 1215, the ambient light sensing element 1216, the conductive pad 1217, the signal connection line 1218 and the power potential line 1219. The arranged positions of all the circuits, the integrated element or the signal line should avoid the optical element light-transmitting region 1211. The circuits and the integrated element need to avoid the position right above the optical element light-transmitting region 1211. In this embodiment, the circuits, the integrated element or the signal line provided in the groove region 1211 need to be avoided from each other to reduce influence from each other and are arranged and provided according to an actual situation.

In an embodiment, a display device is provided. Specifically, the display device may be a glass display device or a flexible display device. Although structures and manufacturing materials of the glass display device and the flexible display device are different, respectively, each of the structures of the glass display device and the flexible display device includes an array substrate, and the array substrate is provided with a groove region with no need to cut a substrate. In this embodiment, a position of an encapsulation substrate of the display device corresponding to the groove region does not need to be cut, and a circuit, a signal line or an integrated element may be provided in the groove region of the substrate of the display device. Such a structure not only reduces the manufacturing difficulty of the groove region, but also reduces a bezel area of the display device, which is beneficial to achieve a narrow bezel of the display device.

Specifically, the display device includes but is not limited to a display panel, a mobile phone, a flat computer, a laptop and a wearable electronic device with a display function.

Figure 6:
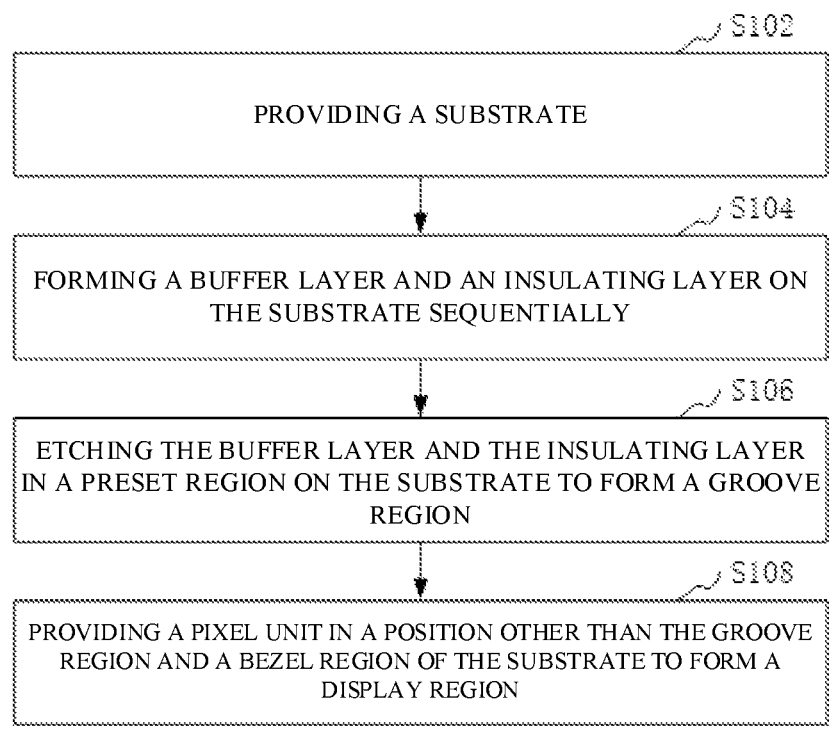
FIG. 6 is a schematic flow chart of a method of manufacturing an array substrate in an embodiment.

In an embodiment, as shown in FIG. 6, a method of manufacturing an array substrate is provided.

In Step S102, providing a substrate.

Specifically, the substrate may be a glass substrate or a flexible substrate. In this embodiment, the substrate has a high light transmittance. The substrate functions as an underlying substrate of the array substrate, and has a certain protective effect.

In Step S104, forming a buffer layer and an insulating layer on the substrate sequentially.

Specifically, film layer structures such as the buffer layer, a gate insulating layer, an interlayer insulating layer and the like are deposited sequentially on the substrate, which can prevent metal ions such as aluminum ions, barium ions, sodium ions and the like in the substrate from diffusing into other film layers during the process of manufacturing the array substrate.

In Step S106, etching the buffer layer and the insulating layer in a first preset region of the substrate to form a groove region.

Specifically, in the first preset region of the substrate, the film layer structures such as the buffer layer, the gate insulating layer, the interlayer insulating layer, and the like are etched, and only a layer of the substrate is remained, so that the groove region has a better light transmittance, thereby an optical element such as a camera and the like may be placed under a position corresponding to the groove region without affecting performance of the optical element.

In Step S108, providing a pixel unit in a second preset region of the substrate to form a display region, and the groove region has a light transmittance greater than a light transmittance of the display region.

Specifically, data driving lines and scanning driving lines are provided crisscross in the second preset region of the substrate, and the pixel units are provided at cross positions of the data driving lines and the scanning driving lines to form the display region. Since multilayered film layer structure and pixel units are provided on the display region, the display region has a low light transmittance.

In the above-described method of manufacturing an array substrate, the groove region with a high light transmittance may be obtained by etching a partial preset region of the film layer structure on the substrate, omitting a complicated process of cutting the substrate, reducing manufacturing difficulty of the groove region of the array substrate. In addition, a circuit, an element, a signal line or the like may be placed in the groove region of the substrate, reducing a bezel area of the display device, thereby increasing a display area of the display device.

Each of the technical features of the above-described embodiments may be combined arbitrarily. To simplify the description, all the possible combinations of each of the technical features in the above embodiments are not described. However, all of the combinations of these technical features should be considered as within the scope of the present specification, as long as such combinations do not contradict with each other.

In view of the above, the present application provides an array substrate, a display device and a method of manufacturing an array substrate.

An array substrate is provided and the array substrate includes:

a substrate provided with a display region and a non-display region;

the display region being configured to display;

the non-display region including a groove region, which has a light transmittance greater than a light transmittance of the display region.

In the above-described array substrate, the groove region is provided on the substrate, reducing the manufacturing difficulty of the groove region. In addition, since the substrate is remained for the groove region and the groove region has a high light transmittance, a circuit, an element or a signal line may be provided in the groove space, which reduces a bezel area of a display device, thereby increasing a display area of the display device.

In an embodiment, an optical element light-transmitting region is preset in the groove region. An area of the optical element light-transmitting region is less than an area of the groove region.

In an embodiment, the array substrate further includes a gate driving circuit provided at a peripheral position of the optical element light-transmitting region in the groove region.

In an embodiment, the array substrate comprises two of the gate driving circuit provided on both sides of the optical element light-transmitting region respectively, and connected several compensation capacitors for compensating light to scanning driving lines of the display region on both sides of the groove region.

In an embodiment, the compensation capacitors are provided between the display region and the gate driving circuit along an edge position of the groove region.

In an embodiment, the array substrate further includes a peripheral circuit provided at a peripheral position of the optical element light-transmitting region in the groove region.

In an embodiment, the peripheral circuit includes at least one of a multiplex selection circuit, an electrostatic discharge circuit, and a screen test circuit.

In an embodiment, the array substrate further includes an ambient light sensing element provided at a peripheral position of the optical element light-transmitting region in the groove region.

In an embodiment, the ambient light sensing element is a photodiode or a photosensitive thin film transistor.

In an embodiment, the non-display region further includes an bezel region, the array substrate further comprises a conductive pad, a signal connection line and a power potential line, the conductive pad is provided at a position in the bezel region opposite to the groove region, the signal connection line is connected to the conductive pad and a data line in the display region through the groove region, and the power potential line is provided in the bezel region and connected to the conductive pad.

In an embodiment, an optical element light-transmitting region is preset in the groove region, routings of the signal connection line and the power potential line are disconnected at a position in the groove region corresponding to the optical element light-transmitting region.

In an embodiment, the data line in the display region is connected to a signal driving circuit of a bonding region through the signal connection line and the conductive pad.

In an embodiment, the groove region forms a non-closed opening region and is opened at one edge of the display region, and an opening direction of the groove region faces to outside of the substrate.

In an embodiment, the groove region forms a closed region and is opened inside the display region.

A display device is provided and the display device includes the array substrate described in the above embodiments.

In an embodiment, the display device is a glass display device or a flexible display device.

A method of manufacturing an array substrate is provided and the method includes the following steps:

providing a substrate;

forming a buffer layer and an insulating layer on the substrate sequentially;

etching the buffer layer and the insulating layer in a first preset region on the substrate to form a groove region; and providing a pixel unit in a second preset region on the substrate to form a display region, wherein the groove region has a light transmittance greater than a light transmittance of the display region.

In the above-described method of manufacturing an array substrate, the groove region with a high light transmittance may be obtained by etching a partial preset region of film layer structures on the substrate, omitting a complicated process of cutting the substrate, reducing manufacturing difficulty of the groove region of the array substrate. In addition, a circuit, an element or a signal line and the like may be placed in the groove region with the substrate, reducing a bezel area of the display device, thereby increasing a display area of the display device.

The above-described embodiments merely represent several embodiments of the present application, and the description thereof is more specific and detailed, but it should not be construed as limiting the scope of the present application. It should be noted that, for a person skilled in the art, several variations and improvements may be made without departing from the concept of the present application, and these are all within the protection scope of the present application. Therefore, the protection scope of the present application shall be subject to the appended claims.

The invention claimed is:

1. An array substrate comprising:
a substrate provided with a display region and a non-display region, the display region being configured to display, the non-display region being provided with a groove region, the groove region having a light transmittance greater than a light transmittance of the display region;
wherein the groove region is preset with an optical element light-transmitting region, and an area of the optical element light-transmitting region is less than an area of the groove region.

2. The array substrate according to claim 1, wherein the groove region forms a non-closed opening region and is defined at one edge of the display region, and an opening direction of the groove region faces to outside of the substrate.

3. The array substrate according to claim 1, wherein the groove region forms a closed region and is defined inside the display region.

4. The array substrate according to claim 1, further comprising one or more gate driving circuits provided at a peripheral position of the optical element light-transmitting region in the groove region.

5. The array substrate according to claim 4, further comprising two gate driving circuits provided on both sides of the optical element light-transmitting region respectively;
wherein:
the display region on both sides of the groove region is provided with a plurality of scanning driving lines; and
the two gate driving circuits connect a plurality of compensation capacitors for compensating light to the scanning driving lines.

6. The array substrate according to claim 5, wherein the compensation capacitors are provided between the display region and the gate driving circuit along an edge position of the groove region.

7. The array substrate according to claim 1, further comprising a peripheral circuit provided at a peripheral position of the optical element light-transmitting region in the groove region.

8. The array substrate according to claim 7, wherein the peripheral circuit comprises at least one of a multiplex selection circuit, an electrostatic discharge circuit, and a screen test circuit.

9. The array substrate according to claim 1, further comprising an ambient light sensing element provided at a peripheral position of the optical element light-transmitting region in the groove region.

10. The array substrate according to claim 9, wherein the ambient light sensing element comprises a photodiode or a photosensitive thin film transistor.

11. A display device comprising the array substrate according to claim 1.

12. The display device according to claim 11, wherein the display device is a glass display device or a flexible display device.

13. An array substrate comprising:
a substrate provided with a display region and a non-display region, the display region being configured to display, the non-display region being provided with a groove region, the groove region having a light transmittance greater than a light transmittance of the display region;
wherein:
the non-display region further comprises an bezel region;
the display region is provided with a data line;
the array substrate further comprises a conductive pad, a signal connection line and a power potential line, the conductive pad being provided at a position in the bezel region opposite to the groove region and being connected to the data line by the signal connection line through the groove region, and the power potential line being provided in the bezel region and connected to the conductive pad.

14. The array substrate according to claim 13, wherein an optical element light-transmitting region is preset in the groove region, and routings of the signal connection line and the power potential line are disconnected at a position in the groove region corresponding to the optical element light-transmitting region.

15. The array substrate according to claim 13, wherein the data line in the display region is connected to a signal driving circuit of a bonding region through the signal connection line and the conductive pad.

16. A method of manufacturing an array substrate comprising:

providing a substrate, the substrate including a first preset region and a second preset region;
forming a buffer layer and an insulating layer on the substrate sequentially;
etching the buffer layer and the insulating layer in the first preset region to form a groove region; and
providing a pixel unit in the second preset region to form a display region;
wherein the groove region has a light transmittance greater than a light transmittance of the display region;
wherein the groove region is preset with an optical element light-transmitting region, and an area of the optical element light-transmitting region is less than an area of the groove region.

* * * * *